United States Patent [19]

Baratti et al.

[11] Patent Number: 4,697,279
[45] Date of Patent: Sep. 29, 1987

[54] TEST/MASTER/SLAVE TRIPLE LATCH FLIP-FLOP

[75] Inventors: James J. Baratti, Los Angeles; Mike McCollough, Inglewood; Glenn P. Gouzoules, El Segundo, all of Calif.

[73] Assignee: Hughes Aircraft Company, Los Angeles, Calif.

[21] Appl. No.: 794,931

[22] Filed: Nov. 4, 1985

[51] Int. Cl.⁴ .............................................. G11C 19/00
[52] U.S. Cl. ...................................... 377/73; 377/77; 307/272.1; 328/104; 328/105
[58] Field of Search ....................... 377/73, 70, 75, 77, 377/28, 29, 64; 307/272 A, 272 R, 243; 328/104, 105, 153, 154; 371/25, 15, 16, 20

[56] References Cited

U.S. PATENT DOCUMENTS

| | | | |
|---|---|---|---|
| 4,390,987 | 6/1983 | Best | 307/243 |
| 4,495,628 | 1/1985 | Zasio | 307/272 A |
| 4,495,629 | 1/1985 | Zasio et al. | 307/272 A |
| 4,580,137 | 4/1986 | Fiedler et al. | 371/25 |

*Primary Examiner*—Stanley D. Miller
*Assistant Examiner*—K. Ohralik
*Attorney, Agent, or Firm*—Leonard A. Alkov; A. W. Karambelas

[57] ABSTRACT

A shift register stage (20) for LSI and VLSI circuits is disclosed and includes a first latching circuit (21) responsive to a data input and for providing a first data output; control circuitry (23) responsive to the first data output and to a parallel data input for providing as a controlled data output a replica of the first data output or a replica of the parallel data input as a function of a control signal; a second latching circuit (25) responsive to the controlled data output and for providing a second data output; and a third latching circuit (27) responsive to the second data output and for providing a third data output. Also disclosed is a shift register (30) for LSI and VLSI circuits which advantageously utilizes the foregoing shift register stage of the invention and which provides for AC or delay testing of an integrated circuit which includes two of such shift registers (30, 60) and a logic network (50) interposed therebetween.

32 Claims, 7 Drawing Figures

FIG. 5

| PERIOD | CLOCK | S100 T | S100 M | S100 S | S200 T | S200 M | S200 S | S300 T | S300 M | S300 S |
|---|---|---|---|---|---|---|---|---|---|---|
| 0 | TCLK | x | x | x | x | x | x | x | x | x |
|   | SCLK | x | x | x | x | x | x | x | x | x |
|   | MCLK | x | x | x | x | x | x | x | x | x |
| 1 | TCLK | A | x | x | x | x | x | x | x | x |
|   | SCLK | A | x | x | x | x | x | x | x | x |
|   | MCLK | A | A | x | x | x | x | x | x | x |
| 2 | TCLK | B | A | x | x | x | x | x | x | x |
|   | SCLK | B | A | A | x | x | x | x | x | x |
|   | MCLK | B | B | A | x | x | x | x | x | x |
| 3 | TCLK | C | B | A | A | x | x | x | x | x |
|   | SCLK | C | B | B | A | x | x | x | x | x |
|   | MCLK | C | C | B | A | A | x | x | x | x |
| 4 | TCLK | D | C | B | B | A | x | x | x | x |
|   | SCLK | D | C | C | B | A | A | x | x | x |
|   | MCLK | D | D | C | B | B | A | x | x | x |
| 5 | TCLK | E | D | C | C | B | A | A | x | x |
|   | SCLK | E | D | D | C | B | B | A | x | x |
|   | MCLK | E | E | D | C | C | B | A | A | x |
| 6 | TCLK | F | E | D | D | C | B | B | A | x |
|   | SCLK | F | E | E | D | C | C | B | A | A |
|   | MCLK | F | F | E | D | D | C | B | B | A |

TEST/MASTER/SLAVE TRIPLE LATCH FLIP-FLOP

BACKGROUND OF THE INVENTION

The disclosed invention relates to large-scale integrated (LSI) and very large-scale integrated (VLSI) circuit structures, and is particularly directed to a logic design structure which includes shift register circuitry that allows testing of the AC characteristics of LSI and VLSI circuitry which incorporates the logic design structure of the invention.

The substantial advances in integrated circuit technology has resulted in LSI and VLSI circuit structures wherein literally hundreds of logic elements are placed on a single silicon chip. However, such high levels of integration present substantial problems in debugging and testing of LSI and VLSI circuits. Such problems are particularly acute with VLSI circuits. Simply stated, due to the nature of LSI and VLSI circuitry, internal nodes cannot be directed accessed and therefore specific internal circuitry cannot be directly tested. Such circuits can only be tested by transmitting and receiving signals through the external input/output (I/O) terminals of the circuits.

In the past, LSI circuits were tested by applying predetermined signals to input terminals and observing the signals at the output terminals. Realistically, such testing merely ascertained whether or not an LSI circuit accomplished certain results in response to the predetermined inputs. The performance of the individual circuitry within the LSI circuit could not be isolated, nor could faults be identified as being caused by specific circuitry.

The need for testability of LSI circuitry has led to the development of LSI design structures which allow limited types of testing and which provide desired insensitivity to AC characteristics such as clock signal rise and fall times and circuit delays.

Such LSI design structures include the use of set/-scan registers wherein all internal storage elements (e.g., latches) are configured so that they can be selectively controlled to operate as shift registers for test purposes. For testing, predetermined input shift registers are configured to provide inputs to a combinational logic network, and predetermined output shift registers are configured to accept and store outputs from the combinational logic network. Test values are serially loaded into the predetermined input shift registers. After the prdetermined input shift registers contain the desired values, the contents of the predetermined output shift registers are observed by serially outputting the contents of the predetermined output registers.

A further development of set/scan registers is set forth in a paper entitled "A Logic Design Structure for LSI Testability," E. B. Eichelberger, et al., Proc. 14th Design Automation Conf., New Orleans, June 20-22, 1977, pp. 462-468. That paper sets forth a design for polarity-hold latches which are asserted to be hazard-free. When two of such latches are incorporated in a shift register latch, the latches of the shift register latch are clocked by non-overlapping clocks. The paper further provides design rules by which the latches disclosed therein are configured for the capability of operating as shift registers in order to simplify testing.

While substantial efforts have been directed to facilitating the testability of LSI circuits, presently known techniques such as those discussed above allow only DC testing of combinational logic whereby such combinational logic is tested only after predetermined values are serially loaded into the predetermined input shift register. Thus, for a given flip-flop in a predetermined input shift register, the value it receives could easily have been the same value that is currently stored in such flip-flop. If this occurs, the combinational logic network fed by such flip-flop will already have been stimulated to the desired test state. As a result, the combinational logic network would not be tested for its capability of being stimulated to the test value of the particular flip-flop.

It is generally accepted that with LSI technology detailed AC testing of combinational logic networks, also known as delay testing, is not possible. See, for example, the above referenced Eichelberger paper at page 466. See also, "Delay Testing LSI Logic," J. J. Shedletsky, Proc. 8th Annual International Conference On Fault Tolerant Computing, 1978, pp. 159-164. Moreover, to the extent AC test capability would be designed into the LSI design structure, it is generally recognized that all shift register latches would have to be capable of storing two values. Providing such capability with known design techniques would result in substantial additional complexity and substantially increased chip area overhead that would have to be devoted to test capability. As a result, the number of functions provided per unit chip area would be reduced.

Although the foregoing discussion generally references LSI circuitry, it also applies to VLSI circuitry with respect to which the lack of AC test capabilities is particularly important.

SUMMARY OF THE INVENTION

It would therefore be an advantage to provide an LSI and VLSI design structure which would allow for AC testing.

It would be a further advantage to provide an LSI and VLSI design structure having AC test capability and which does not require substantial chip area overhead for such capability.

It would be another advantage to provide an LSI and VLSI design structure having AC test capability without substantial additional complexity.

It would be another advantage to provide an LSI and VLSI design structure for shift register latches capable of storing two values which can be efficiently implemented.

The foregoing and other advantages and features of the invention are provided in a shift register stage which includes a first latching circuit responsive to a data input and for providing a first data input; control circuitry responsive to the first data output and to a parallel data input for providing as a controlled data output a replica of the first data output or a replica of the parallel data input as a function of a control signal; a second latching circuit responsive to the controlled data output and for providing a second data output; and a third latching circuit responsive to the second data output and for providing a third data output.

A further feature of the invention is directed to a shift register for LSI and VLSI circuits and which advantageously utilizes the foregoing shift register stage of the invention. The shift register has a plurality of cascaded shift register stages including a first stage and a last stage and includes respective first latching circuitry for each shift register stage for selectively storing serial data and for providing respective first data outputs, the first latching circuit of the first stage being selectively responsive to a serial data input to the shift register; respective control circuitry for each shift register stage responsive to the respective first data outputs and to respective values of a parallel data input to the shift register for providing as respective controlled data outputs respective replicas of the respective first data outputs or respective replicas of the respective inputs of the parallel data input as a function of a control signal; respective second latching circuitry responsive to the respective controlled data outputs and for providing respective second data outputs; and respective third latching circuitry responsive to the respective second data outputs and for providing respective third data outputs, the respective third data outputs being selectively provided in parallel as a parallel data output of the shift register or being selectively provided as serial data to any subsequent respective first latching circuit in the shift register. The third data output of the last stage selectively provides a serial data output of the shift register.

BRIEF DESCRIPTION OF THE DRAWINGS

The advantages and features of the disclosed invention will readily be appreciated by persons skilled in the art from the following detailed description when read in conjunction with the drawing wherein:

FIG. 5 is a state table setting forth the contents of different stages of the shift register of FIG. 3 as certain vectors are serially loaded into the shift register for AC test purposes.

DETAILED DESCRIPTION

Figure 1:
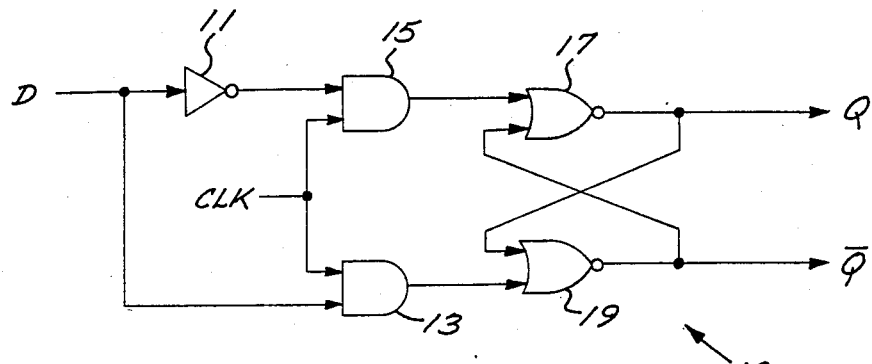
FIG. 1 is a schematic diagram of a latch circuit which may be utilized in the LSI design structure of the invention.

In the following detailed description and in the several figures of the drawing, like elements are identified with like reference numerals.

Referring now to FIG. 1, shown therein is a latch circuit 10 which by way of example may be utilized in the LSI design structure of the invention and includes an inverter 11 for accepting a data input D which is also provided to a two-input AND gate 13. The common node for accepting the data input D shall be considered the D input or the data input of the latch circuit 10. The output of the inverter 11 is provided as an input to a two-input AND gate 15 which accepts as another input a clock signal CLK. The clock signal CLK is also provided as an input to the AND gate 13.

The output of the AND gate 15 is connected as an input to a NOR gate 17, while the output of the AND gate 13 is connected as an input to a NOR gate 19. The output of the NOR gate 17 is provided as another input to the NOR gate 19, and the output of the NOR gate 19 is provided as an input to the NOR gate 17. The non-inverted data output Q of the latch circuit 10 is provided by the output of the NOR gate 17. The inverted data output Q' of the latch circuit 10 is provided by the output of the NOR gate 19.

In operation, the latch circuit 10 will pass data when the clock signal CLK is high. That is, the Q data output is a replica of the data input D while the clock signal CLK is high. The latch circuit 10 latches when the clock signal CLK goes low and retains its latched output while the clock signal CLK stays low. That is, when the clock signal CLK goes low, the Q data output latches to the same logical state as the data input D at the time of the clock transition. The two states of the latch circuit 10 will be referred to as the pass state and the latched state.

Although the latch circuit 10 is disclosed as utilizing positive clock pulses, it should be readily apparent that negative clock pulses could be utilized with appropriate logic changes.

The latch circuit 10 is an example of a class of latching devices generally known as D-type latches or flip-flops. In the following discussion, the terms latch and flip-flop may be utilized interchangeably. The latch circuit 10 has been included for illustration purposes only, and other types of clocked latches or flip-flops may be utilized in the invention.

Figure 2:
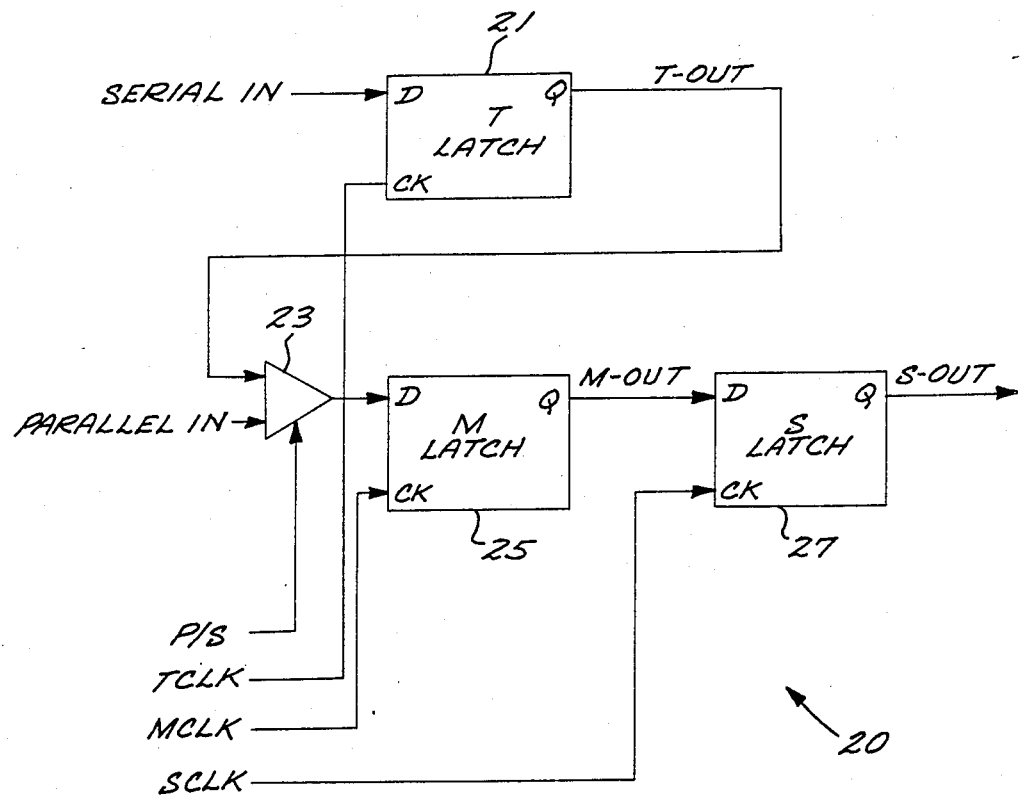
FIG. 2 is a block diagram of a shift register stage of the LSI design structure of the invention.

Referring now to FIG. 2, shown therein is a block diagram of a shift register stage 20 in accordance with the invention and which utilizes a plurality of latch circuits such as the latch circuit 10 shown in FIG. 1. The shift register stage 20 includes a Test (T) latch 21 which accepts as its data input a SERIAL IN data signal and provides as an output a T-OUT data signal. The T-latch 21 is clocked by a clock signal TCLK. The shift register stage 20 further includes a two-input multiplexer 23 which accepts as data inputs the T-OUT data signal from the T-latch 21 and a PARALLEL IN data signal which, as discussed further below, may be provided by a combinational logic network.

The multiplexer 23 is controlled by a Parallel/Shift (P/S) control signal to provide a multiplexer data output which corresponds to the T-OUT data signal or the PARALLEL IN data signal. By way of example, a low P/S signal controls the multiplexer 23 to provide a data output which corresponds to the PARALLEL IN data signal, while a high P/S signal controls the multiplexer 23 to provide a data output which corresponds to the T-OUT data signal. The foregoing protocol for controlling the multiplexer 23 will be utilized in this discussion.

The data output of the multiplexer 23 is coupled to the data input of a Master (M) latch 25 which provides as an output an M-OUT data signal. The M-latch 25 is clocked by a clock signal MCLK which does not overlap with the clock signal TCLK provided to the T-latch 21. Effectively, the multiplexer 23 is utilized to control whether the T-OUT data signal or the PARALLEL IN data signal is provided as the input to the M-latch 25.

The M-OUT data signal from the M-latch 25 is coupled as the data input to a Slave (S) latch 27 which provides an S-OUT data signal as its output. The S-latch 27 is clocked by a clock signal SCLK which does not overlap with the clock signals TCLK and MCLK.

Figure 3:
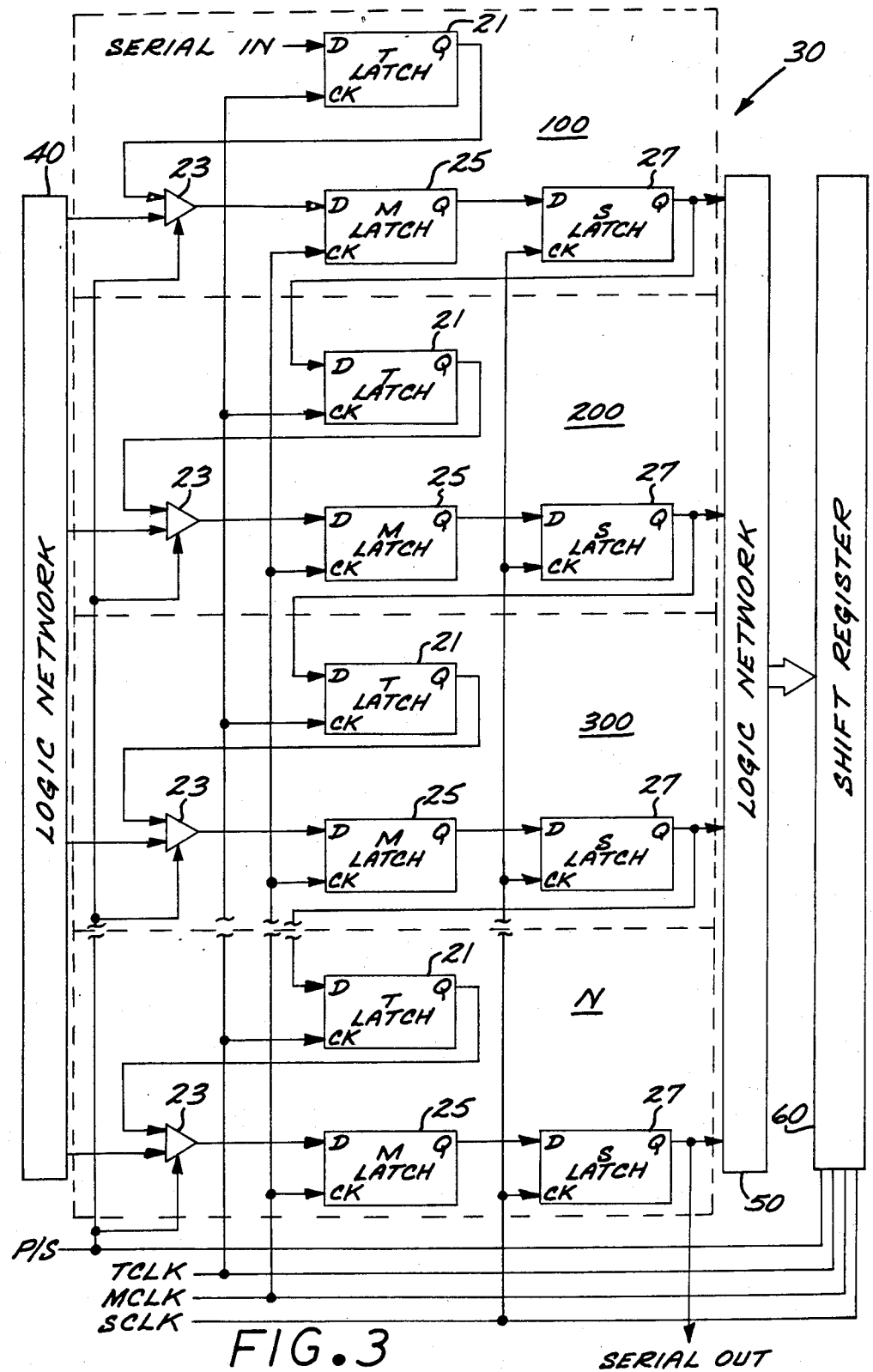
FIG. 3 a partial block diagram of a shift register of the LSI design structure of the invention.

Referring now to FIG. 3, shown therein are four stages of an N-Stage shift register 30 structured in accordance with the invention. Specifically, the shift register 30 includes a first stage 100, a second stage 200, a third stage 300, and an Nth stage N, each of which is substantially identical to the shift register stage 20 shown in FIG. 2. For ease of reference and understanding, corresponding components of the shift register stages 100, 200, 300, N are identified with the same reference numerals as the shift register stage 20 of FIG. 2.

The PARALLEL IN data signals to the multiplexers 23 are provided by a logic network 40, and the S-OUT data signals from the Q data outputs of the S-latches 27 are provided to another logic network 50. The SERIAL IN data signal to the T-latch 21 of the stage 100 is provided from a source external to the shift register 30, while the SERIAL IN data signals to the subsequent stages 200, 300, N are provided by the respective S-OUT data signals from the respective prior stages. Thus, the S-latch Q data output of the stage 100 is coupled to the D-input of the T-latch 21 of the stage 200; and the S-latch Q data output of the stage 200 is coupled to the D-input of the T-latch 21 of the stage 300. A plurality of further shift register stages can be similarly connected in sequence from the S-latch Q data output of the stage 300. The S-latch Q data output of the stage N also provides a SERIAL OUT data output which may be provided to an LSI circuit output terminal.

The T-latches 21 are clocked by the TCLK signal; the M-latches 25 are clocked by the MCLK signal; and the S-latches 27 are clocked by the SCLK signal. As discussed previously, the TCLK, MCLK, and SCLK signals are nonoverlapping.

As will be discussed more fully herein, the shift register 30 provides several functions which are controlled by the P/S signal applied to the multiplexers 23 and the phasing of the latch clock signals TCLK, MCLK, and SCLK. Briefly, such functions generally include (1) latching in parallel data provided from the logic network 40 for parallel transfer to the logic network 50; (2) serially storing input data serially applied to the T-latch D input of the stage 100; or (3) sequentially providing as parallel inputs to the logic network 50 the contents of the S-latches 27 and then subsequently the contents of the M-latches 25, where such contents had been serially stored.

The logic network 50 provides inputs to an appropriate shift register 60 which is substantially similar to the shift register 30. Thus, the shift register 60 would function similarly to the shift register 30 and could provide inputs to another logic network (not shown). As discussed more fully herein, the shift register 30 provides AC test inputs to the logic network 50, and the shift register 60 functions to store the results of the AC test of the logic network 50. The T-latches, M-latches, and S-latches of the shift register 60 are clocked with the latch clock signals TCLK, MCLK, and SCLK provided to the shift register 30; and the multiplexers of the shift register 60 are controlled with P/S control signal provided to the shift register 30.

It should be readily appreciated that for each combinational logic network (such as the networks 40, 50) to be tested, two shift registers similar to the shift register 30 would be required, one for providing inputs and the other for storing results. In the following discussion the shift register 30 will be primarily discussed for ease of understanding, but it should be readily understood that the shift register 60 functions in substantially the same manner since it is clocked and controlled with the same type signals as provided to the shift register 30.

The modes of operation of the shift register 30 generally include Normal Operation, Test Load and AC Test. Such modes of operation will be respectively discussed relative to FIGS. 4A through 4C. The operation mode of Test Load will be also discussed with reference to FIG. 5.

In the Normal Operation mode, the shift register 30 can function (1) as a parallel transfer buffer for data being transferred from the logic network 40 to the logic network 50; or (2) as a standard set/scan register for serially inputting a test vector or for serially outputting set/scan results. For operation as a parallel transfer buffer, the P/S control signal to multiplexers 23 is set to accomplish transfer of the PARALLEL IN data signals from the logic network 40 to the D inputs of the M-latches 25. For the previously discussed example of FIG. 2, the P/S control signal would be low. For operation as a standard set/scan register, the P/S control signal applied to the multiplexers 23 would be hight to couple the T-OUT data signals of the T-latches 21 to the data inputs of the M-latches 25.

For Normal Mode operation as a parallel transfer buffer, the T-latches 21 are not utilized and are maintained in the latched state by having the TCLK signal continuously low. Alternatively, the T-latches 21 may be maintained in the pass state by having the TCLK signal continuously high.

For Normal Mode operation as a standard set/scan register, the T-latches 21 must function as short circuits so that effectively the S-OUT data outputs from the S-latches 21 are provided to the data inputs of the M-latches 25. Therefore, for standard set/scan operation, the TCLK signal must be held continuously high to maintain the T-latches 21 in the pass state.

Figure 4A:
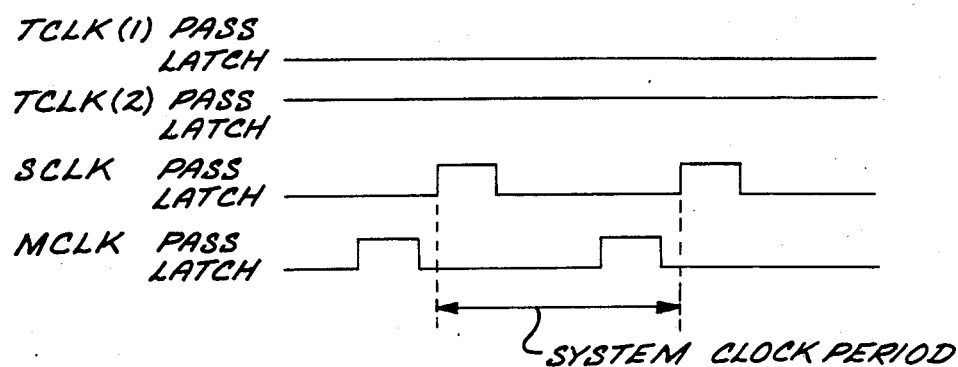
FIGS. 4A through 4C are timing diagrams for different modes of operation of the shift register of FIG. 3.

FIG. 4A illustrates the clock signal timing for the Normal Operation mode wherein the shift register latches 100, 200, 300 operate as conventional master-slave flip-flops for accepting data in parallel or serially. The M-latches 25 and S-latches 27 are clocked by non-overlapping clock signals which are phased to latch data into the M-latches 25 and then subsequently into the S-latches 27. For reference purposes, the positive going edges of the SCLK signal shall be considered as defining a system clock peiod. The MCLK signal can therefore be considered as leading the SCLK signal, as shown in FIG. 4A. Thus, data inputs to the M-latches 25 are latched pursuant to the negative going MCLK signal. The latched M-OUT data signals are subsequently latched at the outputs of the S-latches 25 pursuant to the subsequent negative going SCLK signal.

The continuously low TCLK signal (latched) which may be used for Normal Mode operation as a parallel transfer buffer is shown in FIG. 4A as TCLK(1). The continuously high TCLK signal (pass) which must be utilized for Normal Mode operation as a standard set/-scan register is shown in FIG. 4A as TCLK(2). As stated previously, a continuously high TCLK signal can also be used for Normal Mode operation as a parallel transfer buffer.

When operating as a standard set/scan register, the test data is provided as the SERIAL IN data at the data input of the T-latch 21 of the shift register stage 100. Test results are observed by serially shifting out the SERIAL OUT data at the stage N.

In Test Load operation, the stages 100, 200, 300 are serially loaded with a serially input Test Vector so that after loading the S-latches 27 contain a Setup vector and the M-latches contain a Pulse vector in preparation for the AC Test operation described further herein. The P/S control signal is high so that the T-OUT data signals are provided as data inputs to the respective M-latches 25. The latches are clocked in a sequence so that (1) the data inputs to the T-latches 21 are latched; (2) the data outputs of the M-latches 25 are latched into the S-latches 27; and the data outputs of the T-latches 21 are latched into the M-latches 25. This specific sequence is necessary to respectively load the appropriate Setup and Pulse vectors in the S-latches 27 and the M-latches 25.

Figure 4B:
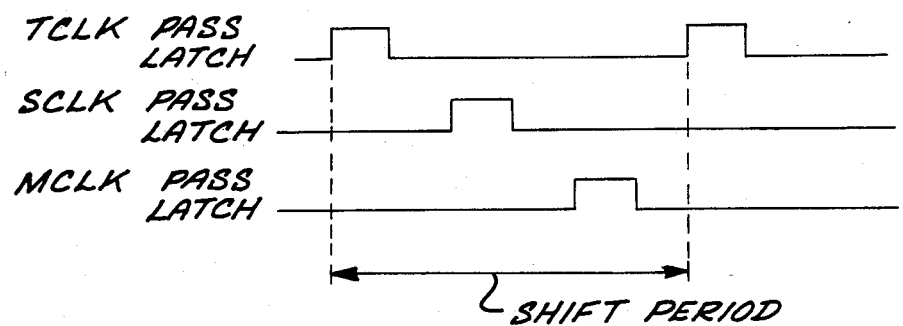

FIG. 4B illustrates the clocking sequence for achieving the foregoing sequence whereby data stored in an M-latch 25 is latched into the associated S-latch 27 and an input to the associated T-latch 21 is latched first into the T-latch 21 and then into the M-latch 25. For reference, the positive edges of the TCLK signal will be considered as defining a Test Load shift period. With reference to all the shift register stages 100, 200, 300, data inputs are initially latched into the T-latches 21 by a TCLK signal pulse to provide latched T-OUT data signals. The M-OUT data signals are latched into the S-latches 27 by an SCLK signal pulse to provide latched S-OUT data signals. It should be noted that the M-OUT data signals are not based on the most recent T-OUT data signals since the M-latches 25 were in the latched state when the T-latches 21 were clocked. The T-OUT data signals are then latched into the respective M-latches 25 pursuant to an MCLK signal pulse to provide latched M-OUT data signals.

In the Test Load operation, the shift register 30 serially stores a Test vector applied to the T-latch data input of the stage 100. The purpose of storing a Test Vector in the shift register 30 is to ultimately have a Setup vector stored in the S-latches 27 and a Pulse vector stored in the M-latches 25. In order to accomplish that, the Setup vector and the Pulse vector are interleaved to form the Test vector, the first element of the Test vector being an element of the Setup vector.

The foregoing operation is, by way of example, illustrated by reference to the State Table of FIG. 5 and relative to the three stages 100, 200, 300 shown in the shift register 30 of FIG. 3. The State Table of FIG. 5 shows the contents of the different latches of the shift register 30 resulting from the occurrences of the TCLK, SCLK, and MCLK signals. In the State Table, the shift register stages 100, 200, 300 are respectively identified as S100, S200, S300; and the individual T-latches, M-latches and S-latches are respectively identified as T, M, and S. The TCLK, SCLK, and MCLK clock signals are so identified.

The Setup vector is shown as including the three elements ACE, where each element is binary. The Pulse vector includes the three elements BDF, and therefore the Test vector is ABCDEF which is input left-most element first (i.e., element A first).

Referring specifically to the State Table of FIG. 5, the following data transfers occur during Period 1 of the Test Load operation within the shift register stage 100. The contents of the other register stages 200, 300 are not pertinent at this time. Pursuant to a TCLK signal pulse, the element A is latched into the T-latch 21 of the shift register stage 100. Pursuant to a SCLK signal pulse nonpertinent data is latched into the S-latch 27 of the shift register 100. Pursuant to an MCLK signal pulse, the element A is then latched into the M-latch 25 of the shift register stage 100.

During Period 2, the following data transfers occur within the shift register 100. The contents of the other two shift register stages 200, 300 are not pertinent at this time. Pursuant to a TCLK signal pulse, the element B is latched into the T-latch 21 of the shift register stage 100. Pursuant to an SCLK signal pulse, the element A is latched into the S-latch 27 of the shift register stage 100. Pursuant to an MCLK signal pulse, the element B is latched into the M-latch 25 of the shift register stage 100.

During Period 3, the following data transfers are accomplished in the shift register stages 100, 200. The contents of the shift register stage 300 are not pertinent at this time. Pursuant to a TCLK signal pulse, the element C is latched into the T-latch of the shift register stage 100 and the element A is latched into the T-latch 21 of the shift register stage 200. Pursuant to an SCLK signal pulse, the element B is latched into the S-latch 27 of the shift register stage 100, and nonpertinent data is latched into the S-latch 27 of the shift register stage 200. Pursuant to an MCLK signal pulse, the element C is latched into the M-latch 25 of the shift register stage 100 and the element A is latched into the M-latch 25 of the shift register stage 200.

During Period 4 of the Test Load operation, the following data transfers occur in the shift registers 100, 200. The contents of the shift register 300 are not pertinent at this time. Pursuant to a TCLK signal pulse, the element D is latched into the T-latch 21 of the shift register stage 100, and the element B is latched into the T-latch 21 of the shift register stage 200. Pursuant to an SCLK signal pulse, the element C is latched into the S-latch 27 of the shift register 200, and the element A is latched into the S-latch 27 of the shift register stage 200. Pursuant to an MCLK signal pulse the element D is latched into the M-latch 25 of the shift register stage 200, and the element B is latched into the M-latch 25 of the shift register stage 200.

During Period 5, the following data transfers occur in the shift register stages 100, 200, 300. Pursuant to a TCLK signal pulse, the element E is latched into the T-latch 21 of the shift register stage 100, the element C is latched into the T-latch 21 of the shift register stage 200, and the element A is latched into the T-latch 21 of the shift register stage 300. Pursuant to an SCLK signal pulse, the element D is latched into the S-latch 27 of the shift register stage 100, the element B is latched into the S-latch 27 of the shift register stage 200, and nonpertinent data is latched into the S-latch 27 of the shift register stage 300. Pursuant to an MCLK signal pulse, the element E is latched into the M-latch 25 of the shift register stage 100, the element C is latched into the M-latch 25 of the shift register stage 300, and the element A is latched into the M-latch 25 of the shift register stage 300.

During Period 6, the following data transfers occur in the shift register stages 100, 200, 300. Pursuant to a TCLK signal pulse, the element F is latched into the T-latch 21 of the stage 100, the element D is latched into the T-latch 21 of the stage 200, and the element B is latched into the T-latch 21 of the stage 300. Pursuant to an SCLK signal pulse, the element E is latched into the S-latch 27 of the stage 100, the element C is latched into the S-latch 27 of the stage 300, and the element A is latched into the S-latch 27 of the stage 300. Pursuant to an MCLK signal pulse, the element F is latched into the M-latch 25 of the stage 100, the element D is latched into the M-latch 25 of the stage 200, and the element B is latched into the M-latch 25 of the stage 300.

Pursuant to the foregoing procedure the Setup vector ACE is stored in the respective S-latches 27 of the shift register stages 300, 200, 100. The Pulse vector BDF is stored in the M-latches 25 of the shift register stages 300, 200, 100. To the extent desire, all of the stages of the shift register stages may be loaded with a Setup vector and a Pulse vector in accordance with the foregoing procedure wherein the vector elements for the stages furthest from the stage 100 are input first. After the appropriate Test vector has been serially loaded, the shift register 30 is ready for AC testing as described further below.

While the Test Load operation has been described above relative to a particular clocking sequence, it can also be achieved with the clocking sequence of SCLK, TCLK, MCLK where the latching signal pulses do not overlap. With such a clocking sequence, the positive edges of the SCLK signal could be considered as defining the Test Load shift period. The purpose of the clock phasing in the Test Load Operation is to Latch the contents of the M-latches 25 into the S-latches 27 prior to latching new data into the M-latches. The T-latches 21 effectively function as temporary buffers for the new data.

The overall functions of the shift register 30 in the Test Load operation perhaps can be best understood by considering the M-latch 25 and the S-latch 27 as the respective master and slave latches of the a master/slave flip-flop, and also by considering the T-latch 21 and the M-latch 25 as the respective master and slave latches of a master/slave flip-flop. While the M-latch 25 serves two different functions, such functions are performed at two different times, which is achieved by having non-overlapping clock signals. Particularly, the M-latch 25 functions as a master latch when its data output is latched into the S-latch 27 pursuant to an SCLK signal pulse. The M-latch 25 functions as a slave latch when it latches the data output of the T-latch 21 pursuant to an MCLK signal pulse.

In preparation for the AC Test mode of operation, the shift register 30 is serially loaded with a Test vector, as described above, which is adapted for testing the logic network 50. Similarly, the shift register 60 is concurrently loaded with data which may also be an appropriate Test vector for testing another logic network (not shown). Alternatively, the shift register 60 may be loaded with predetermined data which is different from the expected correct parallel outputs of the logic network 50 pursuant to Setup vector data and Pulse vector data loaded into the shift register 30. By loading the shift register 60 with such predetermined data, the results of the AC test may be appropriately evaluated. Of course, such predetermined data loaded into the shift register 60 may correspond to an appropriate Test vector for testing another logic network (not shown).

After the Test vector has been loaded, the logic network 50 will have been exercised pursuant to the Setup vector data outputs provided by the S-latches 21 of the shift register 30.

For the AC Test mode, the P/S control signal is set low after the Test vector has been loaded so that the shift registers 30, 60 are responsive to parallel inputs. Subsequently, the Pulse vector data outputs provided by the M-latches 25 are latched into the S-latches 21 so that the Pulse vector data applied as inputs to the logic network 50. The parallel outputs of the logic network 50 in response to the the AC test are stored in the M-latches of the shift register 60. Thus, as to the AC test with the logic network 50, the shift register 30 is a transmit shift register while the shift register 60 is a receive shift register. As to other logic networks (not shown) involved in the AC test, the shift register 30 also functions as a receiver while the shift register 60 also functions as a transmitter.

Figure 4C:
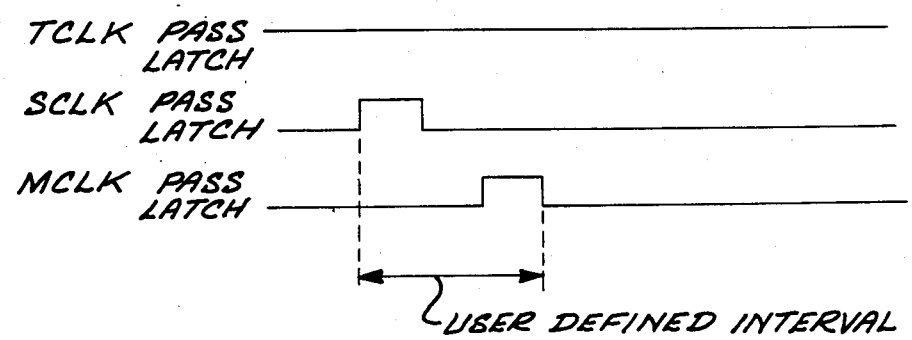

The clock phasing necessary for AC Test operation is illustrated in FIG. 4C. The T-latches 21 are not utilized in the AC Test mode, and the TCLK signal is held low so that the T-latches 21 are in the latched state. Alternatively, the TCLK signal could be held high which would place the T-latches in the pass stage. An SCLK signal pulse is provided to latch the Pulse vector in the S-latches 27 which therefore provide the Pulse vector data to the logic network 50. A subsequent MCLK signal pulse is utilized to store in the M-latches 25 of the shift register 30 the data responses of the logic network 40 to an AC test sequence applied to the logic network 40 by another shift register (not shown) substantially similar to the shift register 30, and to store in the M-latches of shift register 60 the data responses of the logic network 50 to the AC test sequence applied by the shift register 30.

In the AC test operation, the time interval between the positive going pass edge of the SCLK signal and the negative going latch edge of the MCLK signal is a user defined interval which is varied to test the delay characteristics of the integrated circuit including the combinational logic networks 40, 50 and the associated shift registers 30, 60. Such delay characteristics include, for example, propagation delays, setup time prior to clocking of logic elements, package pin delays, connector delays (e.g., where an associated shift register is on another chip), media (e.g., copper or aluminum) delays, loading delays, capacitive delays, ringing and transmission line effects. Thus, the minimum delays may be ascertained by sequentially reducing the user defined interval to determine the shortest interval which can be utilized without creating errors in the data stored by the receiving shift registers.

Pursuant to the AC Test operation, the contents of the shift register 60 are serially outputted for observation of the response of the logic network 50 to the AC Test. Similarly, the contents of the shift register 30 may also be serially outputted, pursuant to the Normal Operation mode described previously, for observation of the response of the logic network 40 to an AC Test. While the test responses are serially outputted, a new Test Vector may be concurrently loaded pursuant to the Test Load operation, described above.

It should be readily understood that while the foregoing description has generally been directed only to 2 logic networks and 2 shift registers, actual VLSI and LSI implementations would include more logic networks and appropriate shift registers. By way of example, all of the shift registers would be clocked and controlled with the same signals; that is, the TCLK, MCLK, SCLK clock signals, and the P/S control signal. Alternatively, each of the shift registers may be configured to have the additional capability of being independently clocked to the extent necessary or desired. For example, it may be desirable to be able to AC test only a portion of an integrated circuit.

The foregoing description has been directed to a shift register stage structure and to a shift register structure which advantageously allow for AC or delay testing of VLSI or LSI circuits which incorporate such structures in their design and implementation. A VLSI or LSI circuit having AC test capability can be evaluated as to its overall delay characteristics which become exceedingly important with increased operating frequencies. As a result of such AC or delay testing, other characteristics such a critical delay paths may also be determined.

Such AC test capability is provided by the invention with only a small increase in chip area utilization over known set/scan registers since for each register stage the disclosed structure utilizes three latches instead of the standard two latches. Moreover, since the T-latches 21 are utilized only to load the setup and pulse vectors and are not utilized for AC testing, the actual implementation of the T-latches 21 may be with slower speed devices. Such implementation would reduce the amount of chip area utilized for providing the T-latches 21.

Although the foregoing has been a description and illustration of specific embodiments of the invention, various modifications and changes thereto can be made by persons skilled in the art without departing from the scope and spirit of the invention as defined by the following claims.

What is claimed is:

1. A shift register stage for large-scale integrated and very large-scale integrated circuits, comprising:
   first latching means responsive to a first clock signal and a data input for providing a first data output;
   control means responsive to a control signal, said first data output and a second data input for providing as a controlled data output a replica of said first data output or a replica of said second data input as a function of the control signal;
   second latching means responsive to a second clock signal and said controlled data output for providing a second data output; and
   third latching means responsive to a third clock signal and said second data output for providing a third data output.

2. The shift register stage of claim 1 wherein said first, second and third clock signals are non-overlapping.

3. The shift register stage of claim 2 wherein for a first mode of operation said control signal controls said control means to provide said replica of said second data input as said controlled data output, said first latching means is not clocked, and said second and third latching means are respectively clocked to function as a master/slave flip-flop.

4. The shift register stage of claim 3 wherein said second clock signal precedes said third clock signal.

5. The shift register stage of claim 2 wherein for a second mode of operation said control signal controls said control means to provide said replica of said first data output as said controlled data output, said second and third latching means are clocked as a master/slave flip-flop, and said first and second latching means are subsequently clocked as a master/slave flip-flop.

6. The shift register stage of claim 2 wherein for a second mode of operation said control signal controls said control means to provide said replica of said first data output as said controlled data output, said first and second latching means are clocked as a master/slave flip-flop, and said second and third latching means are subsequently clocked as a master/slave flip-flop.

7. The shift register stage of claim 2 wherein for a delay path testing mode of operation said control signal controls said control means to provide said replica of said parallel data input as said controlled data output, said first latching means is not clocked, and said third clock precedes said second clock by a user selected time interval.

8. The shift register stage of claim 1 wherein said control means comprises a multiplexer.

9. The shift register stage of claim 1 wherein each of said latching means comprises a clocked D-type latch.

10. A shift register having a plurality of cascaded shift register stages, including a first stage and a last stage, for selectively accepting a serial data input or a parallel data input and for selectively providing a serial data output or a parallel data output, comprising:
    respective first latching means for each shift register stage responsive to serial data and for providing respective first data outputs, said first latching means of the first stage selectively responsive to a serial data input to the shift register;
    respective control means for each shift register stage responsive to said respective first data outputs and to respective parallel data values of a parallel data input to the shift register and for providing as respective controlled data outputs (a) replicas of said respective first data outputs or (b) replicas of said respective parallel data values as a function of a control signal;
    respective second latching means responsive to said respective controlled data outputs and for providing respective second data outputs; and respective third latching means responsive to said respective second data outputs and for providing
    respective third data outputs, said respective third data outputs being selectively provided (a) in parallel as a parallel data output of the shift register, or (b) as respective serial data to any subsequent respective first latching means in the shift register, whereby the third data output of the last shift register stage selectively provides a serial data output of the shift register.

11. The shift register of claim 10 wherein (a) all of said respective first latching means are selectively clocked by a first clock signal, (b) all of said respective second latching means are clocked by a second clock signal, and (c) all of said respective third latching means are clocked by a third clock signal; said first, second and third clock signals being non-overlapping.

12. The shift register of claim 11 wherein for a first mode of operation said control signal controls said respective control means to provide as said respective controlled data outputs said replicas of said parallel data values, said respective first latching means are not clocked, and said respective second and third latching means are clocked to function as respective master/slave flip-flops.

13. The shift register of claim 11 wherein for a second mode of operation said control signal controls said respective control means to provide as said respective controlled data outputs said replicas of said first data outputs, and said first, second, and third clock signals are selectively phased for loading as a serial data input to the shift register a test vector containing setup values and test values, whereby said respective third latching means are latched to the setup values and said respective second latching means are latched to the test values.

14. The shift register of claim 13 wherein for said second mode of operation said respective second and third latching means are clocked as master/slave flip-flops, and said respective first and second latching means are subsequently clocked as master/slave flip-flops.

15. The shift register of claim 13 wherein for said second mode of operation said respective first and second latching means are clocked as master/slave flip-flops, and said respective second and third latching means are subsequently clocked as master/slave flip-flops.

16. The shift register of claim 11 wherein for a delay path testing mode of operation said control signal controls said respective control means to provide as said respective controlled data outputs said replicas of said parallel data values, said respective first latching means are not clocked, and said third clock signal precedes said second clock by a selectable time interval.

17. The shift register of claim 10 wherein each of said control means comprises a multiplexer.

18. The shift register of claim 10 wherein each of said latching means comprises a clocked D-type latch.

19. An integrated circuit structure comprising:
 a first shift register having a plurality of cascaded shift register stages, including a first stage and a last stage, for receiving respective parallel inputs and for providing said parallel inputs as respective parallel outputs;
 a logic network for receiving said parallel outputs of said first shift register and for providing logic network outputs in response thereto;
 a second shift register having a plurality of cascaded shift register stages, including a first stage and a last stage,
 for receiving said logic network outputs as respective parallel inputs and for providing said parallel inputs as respective parallel outputs;
 respective first latching means for each shift register stage responsive to serial data and for providing respective first data outputs, said first latching means of the respective first stages selectively responsive to respective serial data inputs to the respective shift registers,
 respective control means for each shift register stage responsive to said respective first data outputs and to respectively associated shift register parallel inputs and for providing as respective controlled data outputs (a) replicas of said respective first data outputs or (b) replicas of said respectively associated shift register parallel inputs, as a function of a control signal;
 respective second latching means responsive to said respective controlled data outputs and for providing respective second data outputs; and respective third latching means responsive to said respective second data outputs and for providing respective third data outputs, said respective third data outputs being selectively provided (a) in parallel as respective shift register parallel outputs, or (b) as respective serial data to any subsequent respective first latching means in the shift register, whereby the third data output of the last shift register stage selectively provides a serial data output of the shift register.

20. The integrated circuit structure of claim 19 wherein (a) said respective first latching means are selectively clocked by a first clock signal, (b) said respective second latching means are clocked by a second clock signal, and (c) said respective third latching means are clocked by a third clock signal; said first, second and third clock signals being non-overlapping.

21. The integrated circuit structure of claim 20 wherein for a first mode of operation said control signal controls said respective control means to provide as said respective controlled data outputs said replicas of said shift register parallel inputs, said respective first latching means are not clocked, and said respective second and third latching means are clocked to function as respective master/slave flip-flops.

22. The integrated circuit structure of claim 20 wherein for a second mode of operation said control signal controls said respective control means to provide as said respective controlled data outputs said replicas of said first data outputs; and wherein said first, second, and third clock signals are selectively phased for loading as a serial data input to said first register shift register a test vector containing setup values and test values, whereby said respective third latching means of said first register are latched to the setup values and said respective second latching means of said first register are latched to the test values.

23. The integrated circuit structure of claim 22 wherein for said second mode of operation said respective second and third latching means are clocked as master/slave flip-flops, and said respective first and second latching means are subsequently clocked as master/slave flip-flops.

24. The integrated circuit structure of claim 22 wherein for said second mode of operation said respective first and second latching means are clocked as master/slave flip-flops, and said respective second and third latching means are subsequently clocked as master/slave flip-flops.

25. The integrated circuit structure of claim 22 wherein for an AC test mode of operation said control signal controls said respective control means to provide as said respective controlled data outputs said replicas of said shift register parallel inputs, said respective first latching means are not clocked, and said third clock signal precedes said second clock by a selectable time interval, whereby said test values stored in said first shift register are applied as said logic network inputs to said logic network pursuant to said third clock signal and the responses of said logic network are provided as said logic network outputs which are stored in said second shift register pursuant to said second clock signal.

26. The integrated circuit structure of claim 20 wherein for a second mode of operation said control signal controls said respective control means to provide as said respective controlled data outputs said replicas of said first data outputs; and wherein said first, second, and third clock signals are selectively phased for loading as serial data input to said first and second register shift registers respective test vectors containing setup values and test values; whereby said respective third latching means are latched to the setup values and said respective second latching means are latched to the test values.

27. The integrated circuit structure of claim 26 wherein for said second mode of operation said respective second and third latching means are clocked as master/slave flip-flops, and said respective first and second latching means are subsequently clocked as master/slave flip-flops.

28. The integrated circuit structure of claim 26 wherein for said second mode of operation said respective first and second latching means are clocked as master/slave flip-flops, and said respective second and third latching means are subsequently clocked as master/slave flip-flops.

29. The integrated circuit structure of claim 26 wherein for an AC test mode of operation said control signal controls said respective control means to provide as said respective controlled data outputs said replicas of said shift register parallel inputs, said respective first latching means are not clocked, and said third clock signal precedes said second clock by a selectable time interval, whereby said test values stored in said first and second shift registers are respectfully applied as said logic network inputs to said logic network and as inputs to a further logic network pursuant to said third clock signal and whereby the responses of said logic network are provided as said logic network outputs which are stored in said second shift register pursuant to said second clock signal.

30. The integrated circuit structure of claim 20 wherein for a delay path testing mode of operation said control signal controls said respective control means to provide as said respective controlled data outputs said replicas of said shift register parallel inputs, said respective first latching means are not clocked, and said third clock signal prcedes said second clock by a selectable time interval.

31. The integrated circuit structure of claim 19 wherein each of said control means comprises a multiplexer.

32. The integrated circuit structure of claim 19 wherein each of said latching means comprises a clocked D-type latch.

* * * * *